US010145920B2

(12) United States Patent
Rehwald et al.

(10) Patent No.: US 10,145,920 B2
(45) Date of Patent: Dec. 4, 2018

(54) MAGNETIC RESONANCE IMAGING (MRI) SYSTEMS AND METHODS FOR DETERMINING AND ADJUSTING INVERSION TIME (TI) USING SINGLE-LINE ACQUISITION AND AUTOMATIC COMPARTMENT DETECTION

(71) Applicant: Duke University, Durham, NC (US)

(72) Inventors: Wolfgang Rehwald, Durham, NC (US); Elizabeth Jenista, Durham, NC (US); Raymond Kim, Durham, NC (US); David Wendell, Durham, NC (US)

(73) Assignee: Duke University, Durham, NC (US)

( * ) Notice: Subject to any disclaimer, the term of this patent is extended or adjusted under 35 U.S.C. 154(b) by 348 days.

(21) Appl. No.: 15/006,484

(22) Filed: Jan. 26, 2016

(65) Prior Publication Data
US 2017/0212195 A1    Jul. 27, 2017

(51) Int. Cl.
G01R 33/56     (2006.01)
G01R 33/567    (2006.01)

(52) U.S. Cl.
CPC ...... *G01R 33/5602* (2013.01); *G01R 33/5673* (2013.01)

(58) Field of Classification Search
CPC . A61B 5/055; A61B 2573/023; A61B 5/0044; A61B 5/0452; A61B 5/046; A61B 5/7246; G01R 33/50; G01R 33/5602; G01R 33/543; G01R 33/5673; G01R 33/5601; G01R 33/546; G01R 33/56509; G01R 33/4818; G01R 33/563; G06T 2207/30048; G06T 2207/30104
See application file for complete search history.

(56) References Cited

U.S. PATENT DOCUMENTS 7,821,266 B2   10/2010   Feiweier
8,112,145 B2   2/2012    Grist et al.
8,269,495 B2   9/2012    Littmann et al.
(Continued)

OTHER PUBLICATIONS

Chung, Y. C., et al. "Inversion recovery cine trueFISP for optimizing TI in myocardial infarct imaging." Proc. Int. Soc. Magn. Reson. Med. vol. 10. No. 219.2002.
(Continued)

*Primary Examiner* — Ruifeng Pu
(74) *Attorney, Agent, or Firm* — Olive Law Group, PLLC (57) ABSTRACT

Magnetic resonance imaging (MRI) systems and methods for determining and adjusting TI using single-line acquisition and automatic compartment detection. A method includes positioning a readout line of the MRI scanner through a compartment of interest of a region of interest in a subject. The method includes inverting magnetization within the readout line by playing an inversion pulse; and reading out data along the readout line after play of the inversion pulse. The method also includes determining a T1 value for each pixel along the readout line; determining the pixels that belong to first and second portions within the compartment of interest; determining a T1 value of each of the first and second portions by averaging the pixels within each portion; and determining an inversion time based on the determined T1 values such that the compartment of interest has a desired magnetization in an image to be acquired.

49 Claims, 8 Drawing Sheets

(56) References Cited

U.S. PATENT DOCUMENTS

| | | | | |
|---|---|---|---|---|
| 2003/0042905 | A1* | 3/2003 | Miyazaki | G01R 33/5635 324/314 |
| 2008/0150532 | A1* | 6/2008 | Slavin | G01R 33/50 324/318 |
| 2008/0242973 | A1 | 10/2008 | Warmuth | |
| 2012/0101367 | A1 | 4/2012 | Kim | |
| 2012/0161760 | A1* | 6/2012 | Kuhara | A61B 5/055 324/307 |
| 2014/0050379 | A1* | 2/2014 | Miyazaki | G01R 33/56366 382/131 |
| 2014/0247046 | A1* | 9/2014 | Grinstead | G01R 33/4835 324/309 |
| 2014/0314289 | A1 | 10/2014 | Spottiswoode et al. | |
| 2014/0378822 | A1* | 12/2014 | Marrouche | A61B 5/0452 600/413 |
| 2015/0094562 | A1* | 4/2015 | Hardy | G01R 33/5673 600/413 |
| 2015/0099964 | A1* | 4/2015 | Voigt | A61B 5/7292 600/420 |
| 2015/0302599 | A1 | 10/2015 | Crainiceanu et al. | |
| 2015/0309143 | A1* | 10/2015 | Kuhara | G01R 33/50 324/309 |
| 2017/0027496 | A1* | 2/2017 | Pavlides | A61B 5/021 |
| 2017/0231523 | A1* | 8/2017 | Greiser | G01R 33/5601 600/420 |
| 2017/0325707 | A1* | 11/2017 | Spottiswoode | A61B 5/055 |
| 2017/0332940 | A1* | 11/2017 | Marrouche | G01R 33/50 |

OTHER PUBLICATIONS

Kim, R. J., D. S. Fieno, T. B. Parrish, K. Harris, E.-L. Chen, O. Simonetti, J. Bundy, J. P. Finn, F. J. Klocke, and R. M. Judd. "Relationship of MRI Delayed Contrast Enhancement to Irreversible Injury, Infarct Age, and Contractile Function." Circulation 100.19 (1999): 1992-2002. Web.

Messroghli D.R, et al. Modified Look-Locker Inversion Recovery (MOLLI) for High-Resolution T1 Mapping of the Heart. Magnetic Resonance in Medicine 52:141-146 (2004).

Moon, James C., Daniel R. Messroghli, Peter Kellman, Stefan K. Piechnik, Matthew D. Robson, Martin Ugander, Peter D. Gatehouse, Andrew E. Arai, Matthias G. Friedrich, Stefan Neubauer, Jeanette Schulz-Menger, and Erik B. Schelbert. "Myocardial T1 Mapping and Extracellular Volume Quantification: A Society for Cardiovascular Magnetic Resonance (SCMR) and CMR Working Group of the European Society of Cardiology Consensus Statement." Journal of Cardiovascular Magnetic Resonance J Cardiovasc Magn Reson 15.1 (2013): 92. Web.

Nezafat, Maryam, Markus Henningsson, Christian Stehning, Mehmet Akcakaya, Andrea Protti, and Rene Botnar. "A Segmented Modified Look-locker Inversion Recovery (MOLLI) Sequence for High Heart Rate T1 Mapping of Mice." Journal of Cardiovascular Magnetic Resonance J Cardiovasc Magn Reson 17.Suppl 1 (2015): n. pag. Web.

Simonetti, Orlando P., Raymond J. Kim, David S. Fieno, Hanns B. Hillenbrand, Edwin Wu, Jeffrey M. Bundy, J. Paul Finn, and Robert M. Judd. "An Improved MR Imaging Technique for the Visualization of Myocardial Infarction1" Radiology 218.1 (2001): 215-23. Web.

\* cited by examiner

MAGNETIC RESONANCE IMAGING (MRI) SYSTEMS AND METHODS FOR DETERMINING AND ADJUSTING INVERSION TIME (TI) USING SINGLE-LINE ACQUISITION AND AUTOMATIC COMPARTMENT DETECTION

TECHNICAL FIELD

The present subject matter relates to magnetic resonance imaging (MRI). More particularly, the present subject matter relates to MRI systems and methods for determining and adjusting inversion time (TI) using single-line acquisition.

BACKGROUND

Radiology is a medical specialty that uses imaging to diagnose and treat diseases within a patient. A commonly used imaging technique is magnetic resonance imaging (MRI). MRI scanners use strong magnetic fields, radio waves, and field gradients to form images of a patient. One type of MRI is inversion recovery imaging which imparts T1-contrast in the acquired image by playing a spatially non-selective or selective inversion pulse. The time delay from the inversion pulse to acquiring (also called "reading out") data, specifically to the acquisition of the image contrast-relevant line of the raw data space is known as inversion time (TI). During TI the magnetization recovers from its inverted state. Depending on the longitudinal recovery time (T1) of a specific tissue type or other matter, the respective magnetization has experienced a different amount of recovery at the end of the TI period. To obtain the desired image contrast between matter or tissue of different T1 it is crucial to correctly set TI. For example, in late gadolinium enhancement (LGE) TI should be set so that viable normal myocardium has very little signal at the time of acquisition so that it appears black to dark gray in the resulting T1-weighted image. This principle is also known as "nulling" of normal myocardium. In newer MRI applications, the IR pulse is executed together with other preparations such as magnetization transfer preparation or T2-preparation. For these applications, TI should be set so that the magnetization of more than one T1 species (for example blood, normal myocardium, and infarcted myocardium) are ordered in a desired manner. This is more challenging than nulling a single T1 species.

Currently, finding TI manually is a time-consuming, iterative process that requires a well-trained scanner operator. Even experienced operators frequently use suboptimal TI times, especially when a T1-shortening contrast agent has been injected in the patient's blood pool. The contrast agent is continually being filtered out of the blood pool by the kidneys (called renal clearance), but the removal rate is patient- and contrast agent-dependent. As a result, the T1 in blood and tissue changes after the injection of a contrast agent in a continuous but not completely predictable manner. Therefore, the TI needs to be constantly re-adjusted to obtain optimal image contrast. However, scanner operators often do not readjust TI due to a lack of time. For delayed enhancement imaging, where differences in contrast delineate regions of myocardial damage, this can lead incorrect depiction of damaged tissue and in the worst case to missed abnormalities and a wrong diagnosis.

With the introduction of the delayed enhancement sequence for imaging myocardial viability and infarction, the need arose to correctly set TI. The sequence uses an IR pulse followed by a time delay and a data-readout, and requires the injection of a T1-shortening contrast agent. The inverted magnetization recovers exponentially with T1, which is a tissue property. After the injection of the contrast agent, T1 in infarcted myocardium (irreversibly damaged tissue) is shorter than in viable myocardium. Therefore, these tissue types recover at different rates resulting in different signal intensities after the inversion and allowing their differentiation on T1-weighted images. The time delay between IR pulse and readout has to be set so that viable myocardium appears black to dark-gray in the image, indicating that it has no or little signal, also known as "nulled" signal. Infarcted myocardium appears bright due to its shorter T1. For sake of simplicity, this time delay can be regarded as the TI parameter. After the contrast agent injection, initial uptake and later washout lead to a continuously changing contrast agent concentration in blood and tissue, and concurrent T1 changes. That is why the inversion time may need to be continuously re-adjusted for achieving consistent image contrast across all times post injection. Some semi- or fully-automated methods exist for finding and setting TI appropriately (for nulling myocardium).

For at least the aforementioned reasons, there is a need for improved systems and techniques for determining TI and for adjusting TI during imaging of a subject.

SUMMARY

Disclosed herein are MRI systems and methods for determining and adjusting TI using single-line acquisition and automatic compartment detection. According to an aspect, a method includes positioning a readout line of the MRI scanner through a compartment of interest of a region of interest in a subject. The method also includes inverting magnetization within the readout line by playing an inversion pulse. Further, the method includes reading out data along the readout line at a predetermined number of times after play of the inversion pulse. The method also includes determining a T1 value for each pixel along the readout line. Further, the method includes determining the pixels that belong to first and second portions within the compartment of interest. The method also includes determining a T1 value of each of the first and second portions by, for each portion, averaging the pixels within each portion. Further, the method includes determining an inversion time based on the determined T1 values such that the compartment of interest has a desired magnetization in an image to be acquired by an imaging sequence.

BRIEF DESCRIPTION OF THE DRAWINGS

The foregoing aspects and other features of the present subject matter are explained in the following description, taken in connection with the accompanying drawings, wherein.

DETAILED DESCRIPTION

For the purposes of promoting an understanding of the principles of the present disclosure, reference will now be made to various embodiments and specific language will be used to describe the same. It will nevertheless be understood that no limitation of the scope of the disclosure is thereby intended, such alteration and further modifications of the disclosure as illustrated herein, being contemplated as would normally occur to one skilled in the art to which the disclosure relates.

Articles "a" and "an" are used herein to refer to one or to more than one (i.e. at least one) of the grammatical object of the article. By way of example, "an element" means at least one element and can include more than one element.

In this disclosure, "comprises," "comprising," "containing" and "having" and the like can have the meaning ascribed to them in U.S. Patent law and can mean "includes," "including," and the like; "consisting essentially of" or "consists essentially" likewise has the meaning ascribed in U.S. Patent law and the term is open-ended, allowing for the presence of more than that which is recited so long as basic or novel characteristics of that which is recited is not changed by the presence of more than that which is recited, but excludes prior art embodiments.

Ranges provided herein are understood to be shorthand for all of the values within the range. For example, a range of 1 to 50 is understood to include any number, combination of numbers, or sub-range from the group consisting 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50.

Unless specifically stated or obvious from context, as used herein, the term "about" is understood as within a range of normal tolerance in the art, for example within 2 standard deviations of the mean. The term "about" can be understood as within 10%, 9%, 8%, 7%, 6%, 5%, 4%, 3%, 2%, 1%, 0.5%, 0.1%, 0.05%, or 0.01% of the stated value. Unless otherwise clear from context, all numerical values provided herein are modified by the term "about."

Unless otherwise defined, all technical terms used herein have the same meaning as commonly understood by one of ordinary skill in the art to which this disclosure belongs.

Systems and methods in accordance with embodiments of the present disclosure may be used to simplify the operation of an MRI scanner. More particularly, such systems and method may simplify operation by automatically setting the timing parameter TI. This automation may be applicable to pulse sequences that employ an inversion-recovery (IR) pulse for any suitable purpose such as, but not limited to, T1-weighting, fat suppression, or blood suppression. Such sequences can require the TI parameter to be set such that a region of interest (e.g., tissue or liquid of a specific T1, and which is also referred to herein as a "compartment of interest") has its magnetization (i.e., signal or brightness) conditioned in a desired way, for example suppressed or "nulled". This sequence may be referred to as an "imaging sequence," or also an "adjustment sequence" when describing embodiments of the present disclosure.

In an example use of the presently disclosed subject matter, myocardial delayed enhancement imaging of the heart with the IR Turbo fast low angle shot (Turbo-FLASH) sequence is employed as an example for an imaging sequence. In this context, the compartment or region of interest is viable myocardial tissue (myocardium) in the presence of a T1-shortening contrast agent. Another targeted application of the presently disclosed application is the class of flow-independent dark-blood delayed enhancement (FIDDLE) imaging sequences. In that context, two compartments of interest can be considered, which are myocardium and blood in the presence of a T1-shortening contrast agent. Note that systems and methods in accordance with the present disclosure can be applied to any body-region in connection with any IR prepared imaging sequence, and with any type and number of regions of interest.

Figure 1:
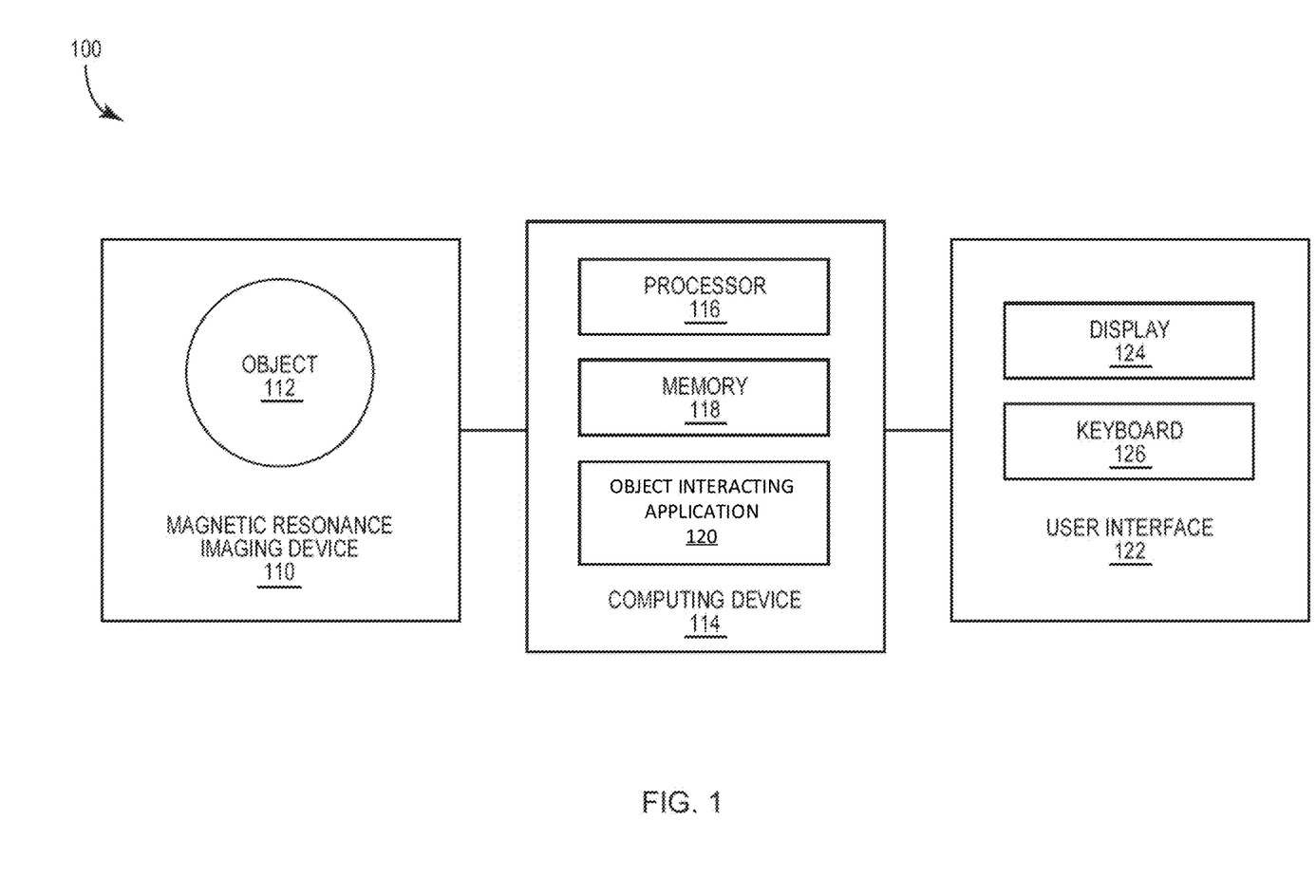
FIG. 1 is a block diagram of an example MRI system within which methods in accordance with embodiments of the present disclosure may be implemented.

FIG. 1 illustrates a block diagram of an example MRI system 100 within which methods in accordance with embodiments of the present disclosure may be implemented. Referring to FIG. 1, the system 100 may include an MRI device 110. The MRI device 110 may be configured for scanning and capturing an image of an object 112 such as an anatomical image of an object. Example objects to be imaged include, but are not limited to, brain tissue, kidney tissue, liver tissue, heart tissue, and any other bodily tissues. The MRI system 100 may include a computing device 114. The computing device 114 may include a processor 116, a memory 118, and an object interacting application 120 that is configured to execute on the processor 116. The MRI system 110 may include a user-interface 122, such as an image generator, that is configured to display images on a display 124 and to receive user input through a user input device, such as, for example, a keyboard 126. In accordance with embodiments of the present disclosure, automatic TI adjustment may be provided by the following example steps: acquisition of a single data line at a predetermined location which includes the compartment or region of interest; calculation of the pixel T1 values along the single line; compartment localization along the single line (for example myocardium and blood compartments) based on their T1 values; calculation of TI; and setting the TI parameter for the subsequent imaging sequence such that the compartment of interest is magnetically conditioned in a desired way. It is noted that a T1 value is the longitudinal relaxation time and can indicate the speed with which tissue or other matters returns to its equilibrium magnetization after having experienced a magnetic inversion. T1 is the inverse of the longitudinal recovery rate.

Figure 2:
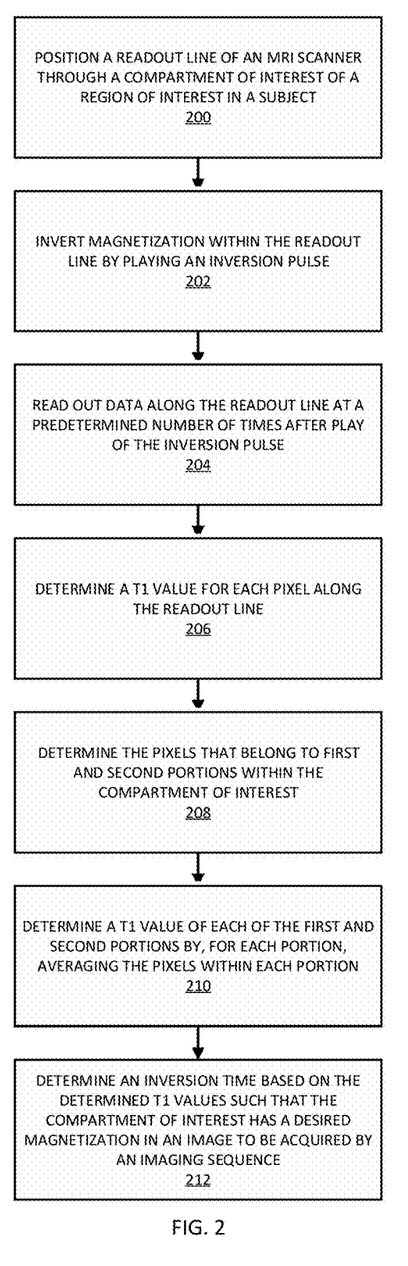
FIG. 2 is a flow chart of an example method for determining TI in accordance with embodiments of the present disclosure.

FIG. 2 illustrates a flow chart for adjusting an inversion time setting in a MRI scanner in accordance with embodiments of the present disclosure. Reference is made by example to the MRI system 100 of FIG. 1, although it should be understood that the method may be implemented by any suitable MRI system. Referring to FIG. 2, the method includes positioning 200 a readout line of the MRI scanner through a compartment of interest of a region of interest in a subject. For example, the system 100 can be controlled to position a readout line. The method of FIG. 2 also includes inverting 202 magnetization within the readout line by playing an inversion pulse.

The method of FIG. 2 also includes reading 204 out data along the readout line at a predetermined number of times after play of the inversion pulse. The method includes determining 206 a T1 value for each pixel along the readout line. The method also includes determining 208 the pixels that belong to first and second portions within the compartment of interest. Further, the method includes determining 210 a T1 value of each of the first and second portions by, for each portion, averaging the pixels within each portion. The method also includes determining 212 an inversion time based on the determined T1 values such that the compartment of interest has a desired magnetization in an image to be acquired by an imaging sequence.

In accordance with embodiments of the present disclosure, systems and methods described herein rapidly apply "TI adjustment" similar to other routine adjustment procedures such as frequency adjustment, coil sensitivity adjustment, or the like. This TI adjustment can be executed prior to each inversion recovery image acquisition. It may also be repeated every two minutes, three minutes, or other suitable time period during longer acquisitions such as 3D scans of typically 10-20 minutes duration.

In accordance with embodiments of the present disclosure, an example system may include a user interface providing an operator with the ability to adjust TI. For example a TI-adjustment button may be provided on an MRI scanner's user interface. Pressing the button can trigger the above described adjustment sequence. Acquisition of the data and calculation of the optimal TI can be done within two heartbeats or less.

It is noted that systems and methods in accordance with embodiments of the present disclosure may be a combination of the following components: applying a non-selective IR pulse and acquiring a single line of data repeatedly at specific times relative to the IR pulse in a precisely known anatomical location; calculating the T1 values of each pixel along this line based on the T1-recovery derived from the acquired data; detecting the compartment of interest to be nulled or otherwise conditioned based on the pixel T1 values along the line; and calculating the inversion time to be used for the following imaging sequence based on the T1 in the compartment of interest (e.g., healthy myocardial tissue in the septum).

In accordance with embodiments of the present disclosure, a function of an automatic TI adjustment sequence described herein is the operator-independent, rapid, and therefore repeatable calculation of an optimal TI. This TI can be optimal in the sense that it achieves the desired magnetic conditioning in a compartment of interest within an imaged subject and thereby creates a desired image contrast. An example for magnetic conditioning is delayed enhancement imaging where the compartment of interest is viable myocardium and the magnetic conditioning is its nulling. Another example is finding the intersection of two T1-recovery curves associated with two compartments of interest such as myocardium and blood in the presence of a T1-shortening contrast agent. Such conditioning may be needed for the class of flow-independent dark blood delayed enhancement (FIDDLE) sequences where the preparation module combines tissue signal reduction with a trailing IR pulse to achieve the desired magnetic conditioning.

Another part of the presently disclosed subject matter can be passing the derived optimal TI value to the sequence run immediately after the invented adjustment sequence. The invention calculates the optimal TI specifically for the subsequent imaging sequence.

A single preparation module (non-selective IR pulse for delayed enhancement or combined tissue-signal reduction and IR for the class of FIDDLE sequences) may play and read out a single line repeatedly at increasing time points after the preparation. The latest readout is typically at the end of the second RR interval (about 2×800 ms to 2×1000 ms) so that techniques disclosed herein only needs two heartbeats. Due to this small time requirement it can be executed repeatedly as a quick adjustment sequence at any time during an MRI exam, for example before each acquisition of a 2D delayed enhancement or FIDDLE image. It may also be repeated every two or three minutes during longer 3D acquisitions which can run for 10-20 minutes or any other suitable time period.

In an example, the data readout is only placed in the diastolic phases of the RR intervals. This automatically ensures pixel alignment across the acquired time points after the IR pulse. Pixel T1 calculation may therefore work without additional motion correction. When applying systems or methods disclosed herein to organs other than the heart, ECG triggering and placing the data readout in the diastolic phases may not be necessary.

It is noted that the present subject matter can be used to produce standardized image quality across scanning personnel as it makes the choice of TI operator-independent.

In another implementation, the preparation may use a combination of a leading T2-preparation (T2-prep) with a trailing IR pulse or a leading magnetization transfer preparation (MT-prep) with a trailing IR pulse, or the combination of any other suitable preparation with trailing or leading IR pulse. In this implementation, the acquired signal of blood and myocardium may then be used to determine the intersection of the T1-recovery curves of blood and myocardium after having been subjected to any of the aforementioned preparation combinations. The time of the intersection can then be used to set the inversion time for a dark-blood delayed enhancement sequence.

Systems and methods in accordance with embodiments of the present disclosure can provide several advantages over previous efforts. As an example, systems and methods disclosed herein may only acquire a single line rather than an entire image, thus reducing time requirements. As another example, in the presence of a (T1-shortening) contrast agent, systems and methods disclosed herein may only need two cardiac RR intervals (about 2 seconds), compared to 10-20 RRs for other technologies. If no contrast agent is present, it may need three to four RR intervals depending on the compartment of interest with the longest T1.

In another example advantage, low or no operator intervention is needed. The single line needs to be placed to include the compartment(s) of interest, which, in cardiac MR, are myocardium and blood pool. In some MRI scanners, localization software can be used to place the single line without user input. The localization software can automatically find and store the positions and orientations of the standard cardiac views which determine the single line's position and direction. For systems of other technologies, the single line needs to be placed by the operator in the graphical user interface (GUI), which is quick and only needed once per exam.

In yet another example advantage, systems and methods disclosed herein may not require a breath hold, because the single line is acquired in a mid-ventricular short-axis cardiac view where respiration typically causes little slice shift. Furthermore, in such cardiac slice, the blood-myocardium border does not significantly shift when translating in the through-plane (base-apex) direction. Therefore, even in the unlikely case of larger-than-average through-plane shifts with the respiratory phase, the blood-myocardium border will be hardly affected. The compartments of interest, blood and myocardium, may remain localized and separable. Due to these reasons, the effects of breathing on the acquired data are so minimal that breath holding is not necessary.

Systems and methods disclosed herein can be seamlessly integrated into an MRI scanner's software-framework. More particularly, systems and methods disclosed herein can be executed automatically by the scanner software according to predefined rules. In an example, a method in accordance with embodiments of the present disclosure can be launched by the operator's push of a button. Also, a user interface may implement an adjustment option as a service sequence. Further, for example, it may be implemented as a TI-adjustment button named "capture-TI" analogous to the "capture-cycle" button that captures the patient's RR interval.

It is noted that systems and methods disclosed herein can cause low magnetic saturation by its readout as it reads out very few lines of data. Therefore, it captures T1 or the intersection of two curves (for example blood and myocardium) more accurately than other techniques. This "true" T1 value can subsequently be used to calculate the optimal TI based on what type of readout, flip angle, RR-interval, and effective TR the following imaging sequence may use.

Due its ease of use, the scanner operator may be likely to run the disclosed TI-adjustment repeatedly while the contrast agent is washing out of the blood pool. This should result in more accurate TI times and more consistent image quality than with other techniques.

Figure 3:
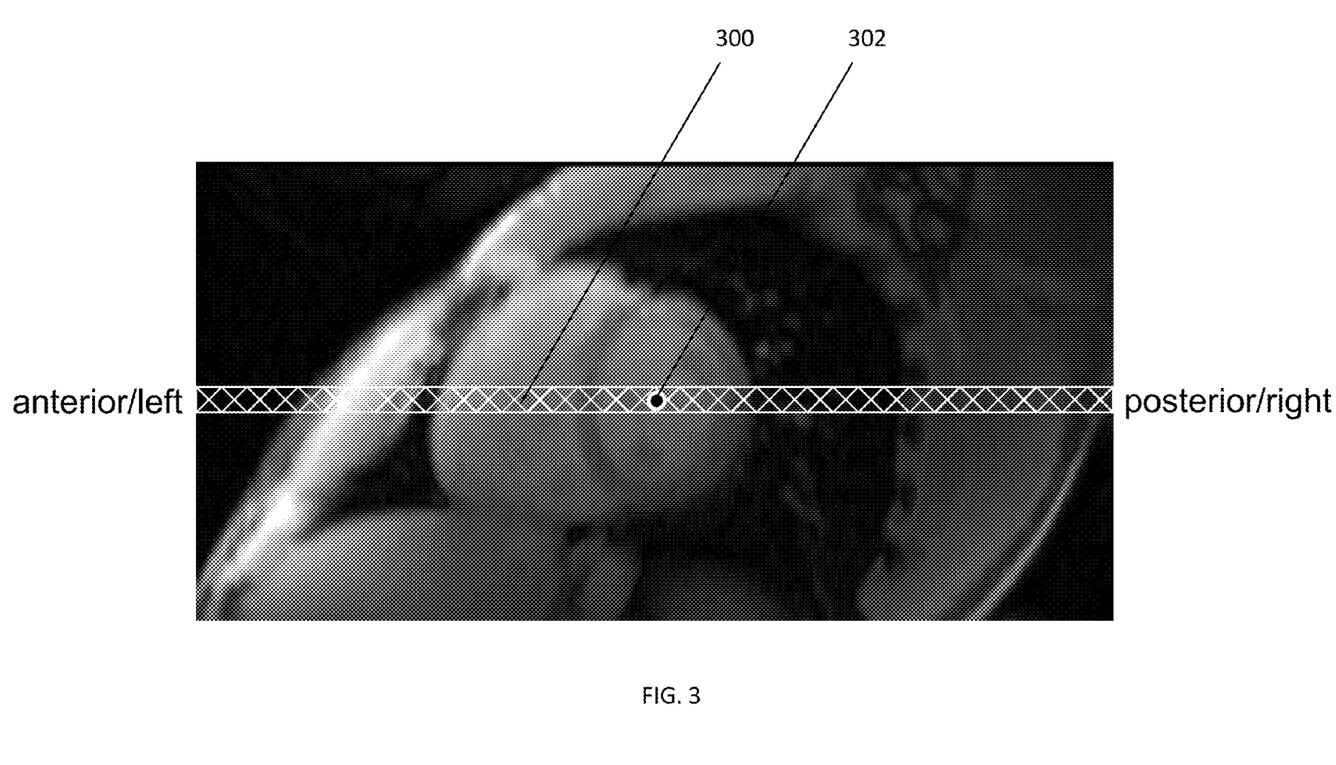
FIG. 3 is an MRI image of a heart showing placement of a readout line in accordance with embodiments of the present disclosure.

In accordance with embodiments of the present disclosure, a-priori knowledge may be needed for correct placement of the readout line. It is noted that a readout line can be any suitable line along which data is acquired. The readout line may be series of image pixels. A readout line may have, for example, a cross section of a square, circle, or the like. The excitation pulse (also referred to herein as a "readout pulse") excites a thick readout line 300 shown as hatched structure in FIG. 3, which illustrates an MRI image of a heart. Referring to FIG. 3, a center of the readout line 300 must be placed inside the left ventricular blood pool, which is shown as a bright dot 302. The line location and orientation can be automatically calculated in accordance with embodiments of the present disclosure as the intersection of two standard cardiac views, a mid-ventricular short-axis view, and the cardiac four-chamber view, which are both known (a-priori knowledge) to the scanner's automation framework such as, but not limited to, the Siemens Dot Engine. The center of the left-ventricular cavity is also known to the framework so that the center of the line can be placed correctly. For MRI scanners without automation framework, the scanner operator may manually place this line in a GUI such that it matches positioning of the readout line 300 shown in FIG. 3. Such manual positioning may only be needed once per exam.

The two-dimensional (2D) excitation can be implemented in different ways. One implementation uses a 2D pulse transmitted by a single RF coil. Such pulse can be referred to as a "pencil-beam pulse." Another implementation uses multiple coils transmitting in parallel ("parallel transmit"). The excitation signals are superimposed thereby creating a 2D (line) excitation.

Figure 4:
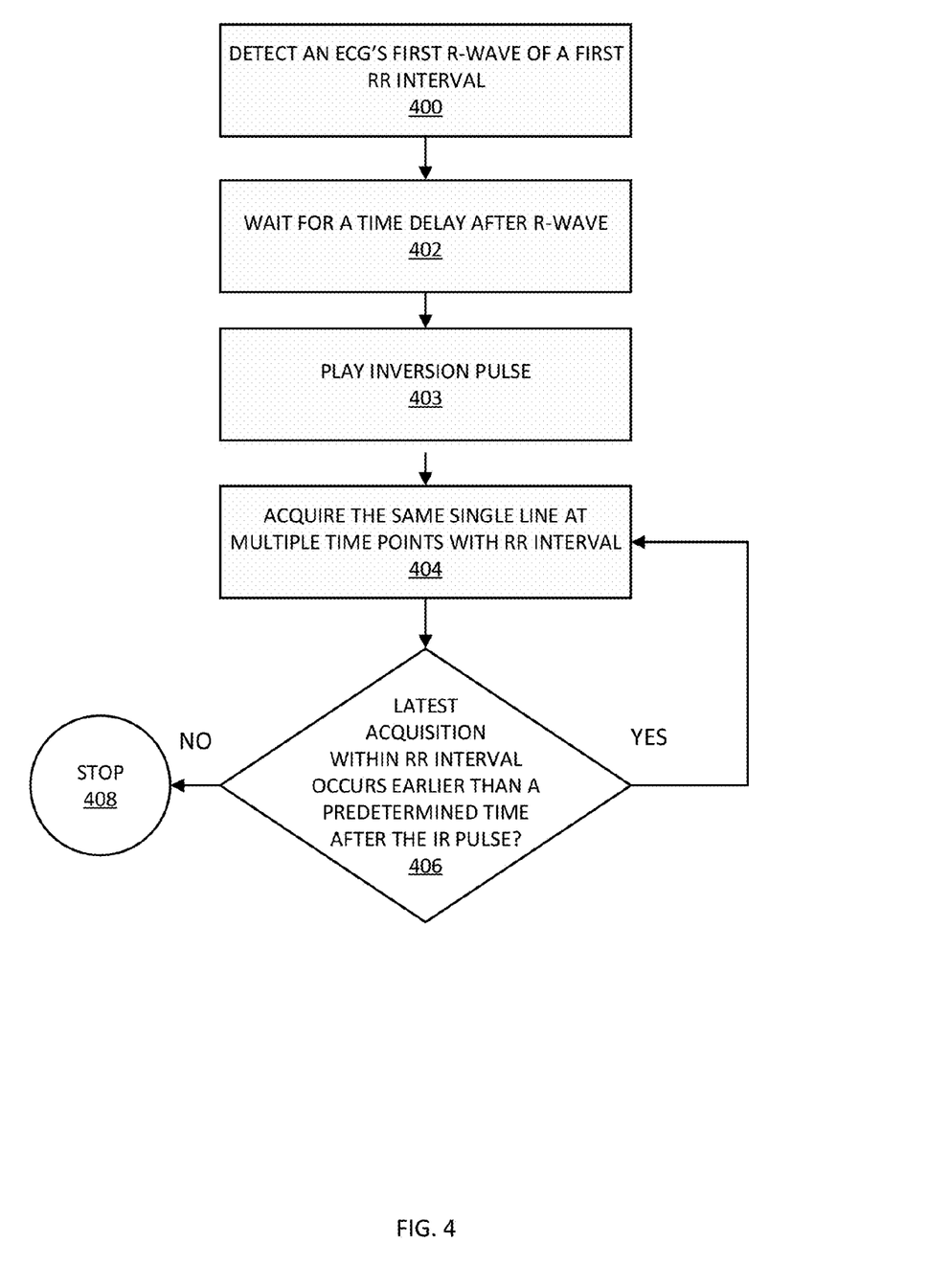
FIG. 4 is a pulse sequence diagram of an example method for timing IR pulses and readout pulses in accordance with embodiments of the present disclosure.

In accordance with embodiments of the present disclosure, the inversion recovery (IR) pulse and the readout pulses may be timed relative to an electrogradiogram's (ECG) and relative to each other. FIG. 4 illustrates a pulse sequence diagram of an example method for timing IR pulses and readout pulses. It should be understood that the method may be implemented by any suitable MRI system. Referring to FIG. 4, the method includes detecting 400 an ECG's first R-wave of a first RR interval and defining this time as 0 ms. The method also includes waiting 402 for a time delay (TD) after this R-wave. The TD can be anywhere from 0 ms (no delay) to 500 ms. The method also includes playing 403, in this first RR interval, a spatially non-selective IR pulse at the end of TD.

The method of FIG. 4 also includes acquiring 404 the same single line (same location and same imaging parameters) at multiple time points within the RR interval. For example, for approximately the next 2000 ms, which typically corresponds to two or three heart beats depending on the patient's RR duration. The acquisition can start as early as 50 ms after the IR pulse and can be repeated approximately every 100 ms thereafter until the first RR is over as indicated by the detection of the next (a second) R-wave. The acquisition may not occur any earlier than 250 ms after the first R-wave in order to avoid systolic cardiac phases with too much positional difference of the heart compared to the diastolic phases.

The method of FIG. 4 also includes determining 406 whether the latest acquisition within the RR interval occurred earlier than a predetermined time period after the IR pulse. In an example, the predetermined time period may be 2000 ms. If it is determined at step 408 the latest acquisition occurred earlier than the predetermined time period after the IR pulse, step 404 is repeated until the predeteremined time period reached. This may lead to a total heartbeat number of three or more. If not, the method stops at block 408.

Figure 5:
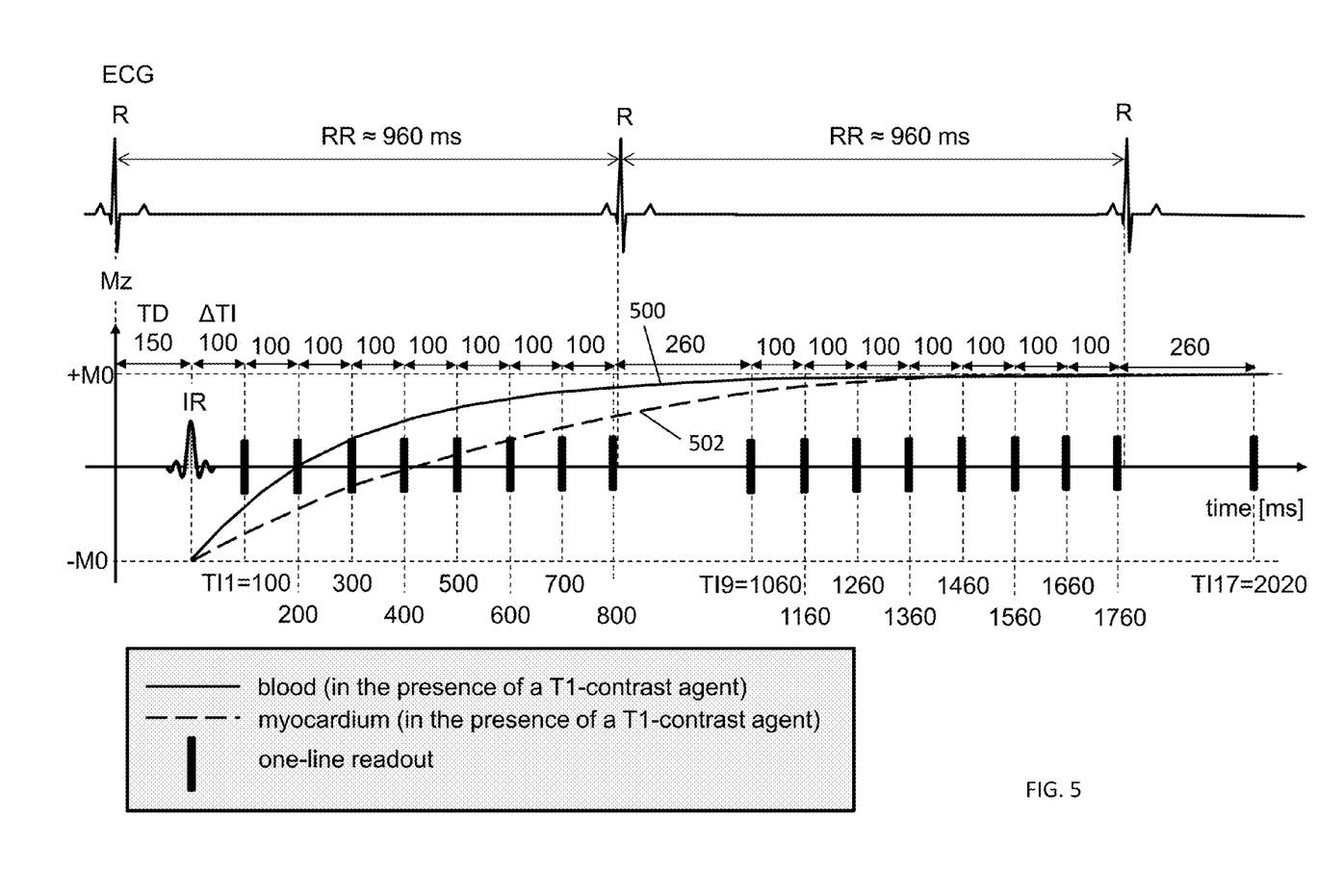
FIG. 5 are graphs depicting exemplary timing of an ECG signal, its R-waves, the single IR pulse, and the repeated readout pulses applied throughout multiple heart beats.

FIG. 5 illustrates graphs depicting exemplary timing of an ECG signal, its R-waves, the single IR pulse, and the repeated readout pulses applied throughout multiple heart beats. In this example, a TD of 150 ms, a first TI (TI1) of 100 ms, and a spacing between the TI values of $\Delta TI=100$ ms is used. The RR is 960 ms and 17 readout lines with TI1=100 ms to TI17=2020 ms are acquired. The solid line 500 shows the T1-relaxation curve of the blood compartment, and the dashed line 502 that of myocardium compartment, both in the presence of a T1-shortening contrast agent.

Figure 6A:
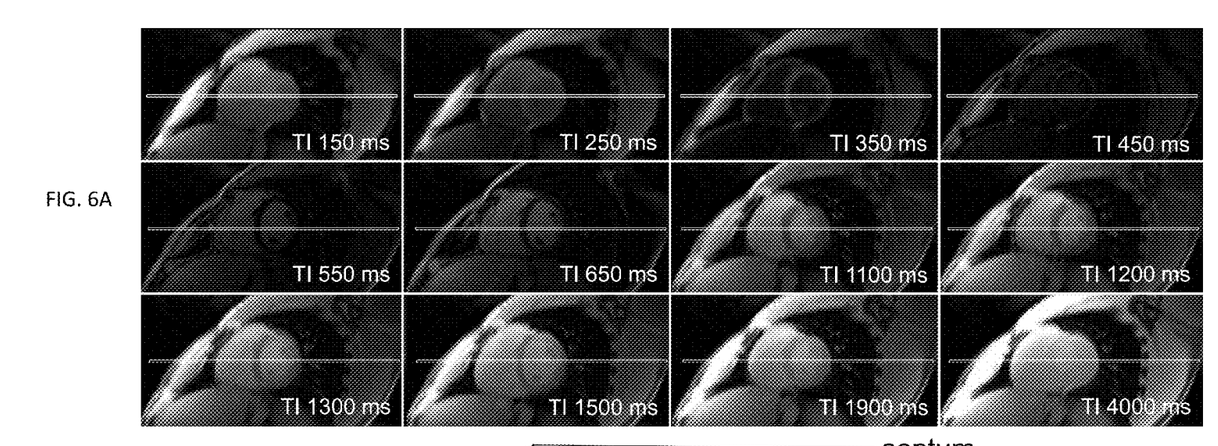
FIG. 6A are images showing a mid-ventricular short-axis view of a subject's heart.
Figure 6B:
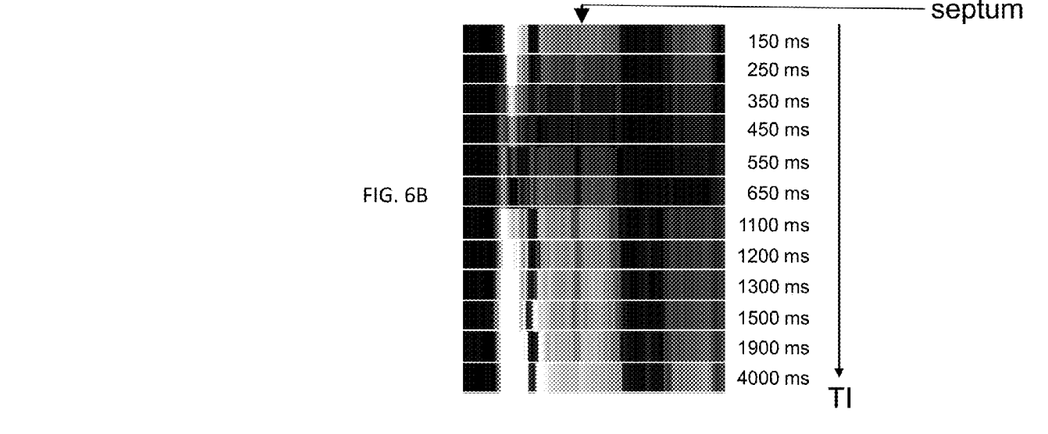
FIG. 6B shows a single line acquired at 12 different time points (TIs) after the IR pulse.

Plotting the acquired data for each pixel as function of time after the IR pulse can create the pixel's T1-recovery curve. Each curve may contain about 10 to 20 data points. FIG. 6A illustrates images showing a mid-ventricular short-axis view of a subject's heart. For illustration purposes, the entire image was acquired repeatedly at different time points after the IR pulse (at different TIs). It is noted that acquisition may only be the single line in the center of each image, outlined in white color. For these example images, TI values between 150 ms and 4000 ms were chosen for demonstration purposes, but typically a maximum TI of 2000 ms is sufficient in the presence of a T1-shortening contrast agent. FIG. 6B shows this single line acquired at 12 different time points (TIs) after the IR pulse. The time axis goes from top to bottom and is labeled with the used TIs. The individual pixels are plotted left to right.

For each pixel, the recovery signal data may subsequently be fitted to a T1-recovery curve which yields the T1 for that pixel. The intermediate result is a line of the pixel T1-values. This line shows an abrupt change of T1 between blood pool compartment and the myocardium compartment.

To classify the pixels into either the blood compartment (in the left ventricle LV or right ventricle RV) or the myocardium compartment, an edge detection algorithm may be performed on the T1 data in the line. The algorithm starts at the center of the line, which is already known to be inside the LV blood pool. The search direction is to the right/anterior, because the septum is on the right side of the LV cavity. Right/left, anterior/posterior, and head/foot directions may always be known to the MRI scanner. It may be easier to find the septum than the LV free wall, because the septum is neighbored by blood on both sides, and these borders are easily localized by the abrupt change of T1. Systems and methods disclosed herein may thus take the septal myocardium as compartment representative of all viable myocardium.

Figure 7A:
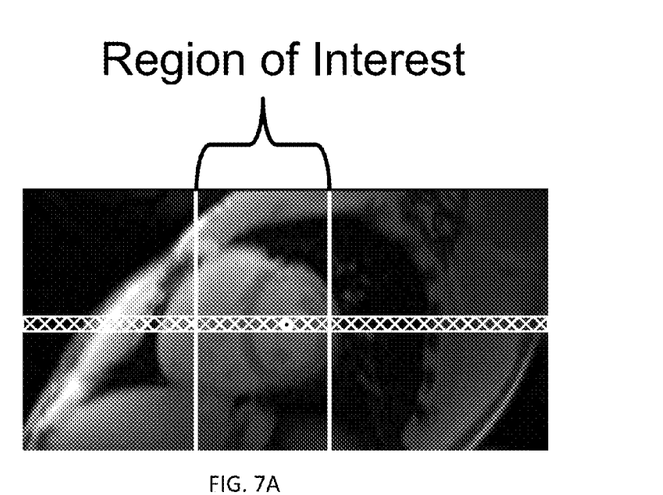
FIG. 7A is an image depicting the mid-ventricular short-axis view of the heart and the optimal placement of the readout line.
Figure 7B:
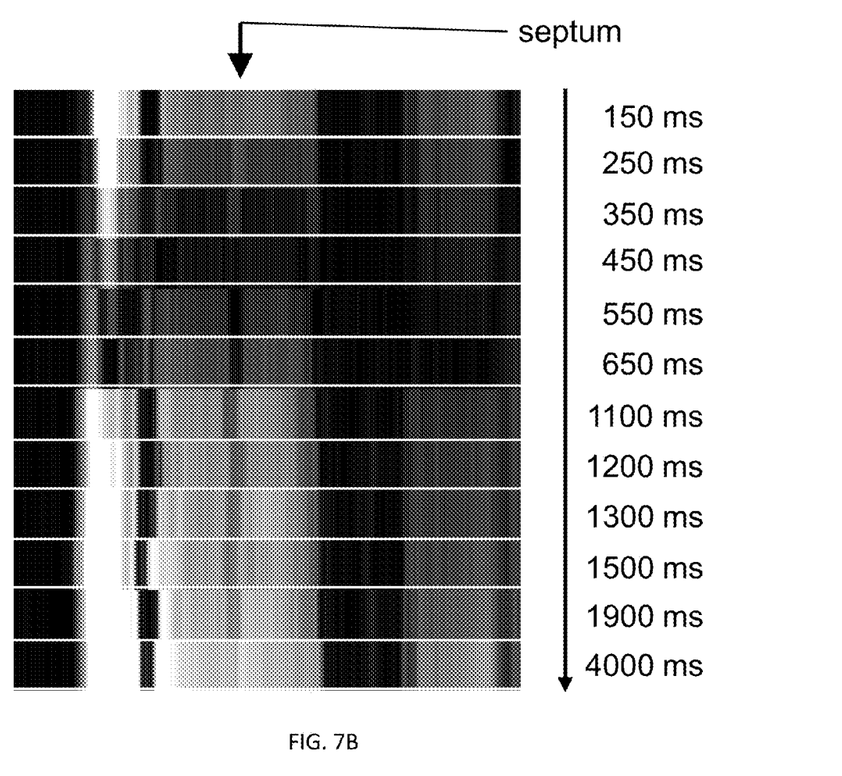
FIG. 7B shows the line acquired at 12 different TIs after the IR pulse.
Figure 7C:
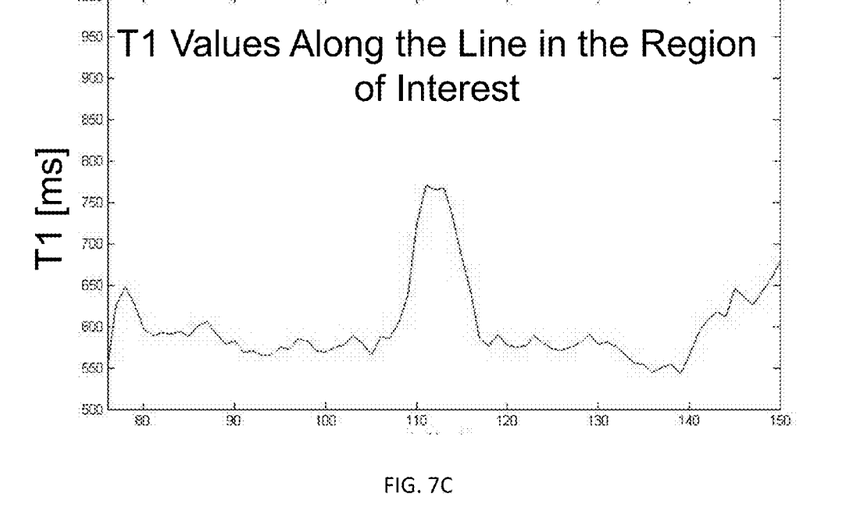
FIG. 7C is a graph depicting the pixel T1 values along the line.
Figure 7D:
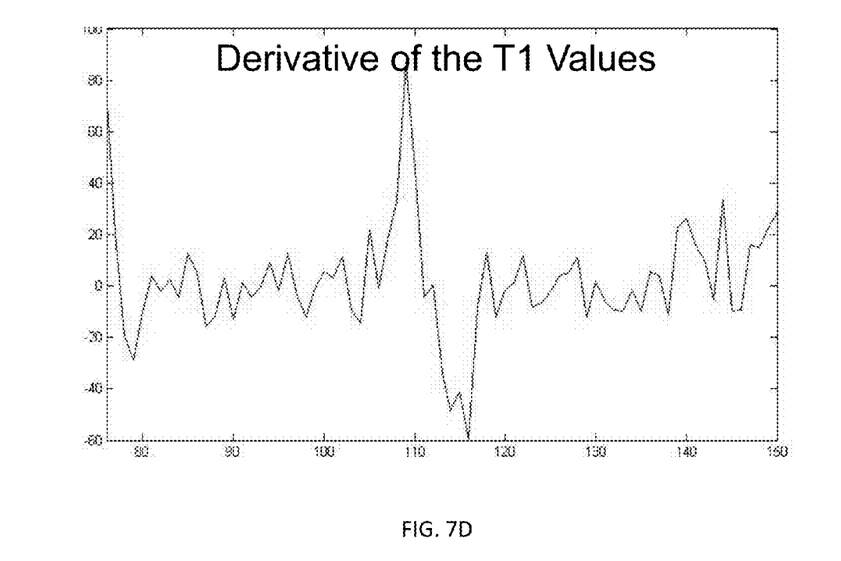
FIG. 7D is a graph showing the derivative of the T1 values.

FIG. 7A is an image depicting the mid-ventricular short-axis view of the heart and the optimal placement of the readout line. FIG. 7B shows the line acquired at 12 different TIs after the IR pulse (same as in FIG. 5). The time axis goes from top to bottom in FIG. 7B. The individual pixels are plotted left to right. FIG. 7C is a graph depicting the pixel T1 values along the line. It is noted that of the acquired 256 pixels, only about 75 pixels from number 76 to 150 are shown to zoom up on the region of interest labeled in FIG. 7A. It can be appreciated that the change from blood to septum is rather rapid and occurs at pixel 109 at the RV-septum border, and at pixel 116 at the septum-LV border. As edge detection, the derivative of the T1 data can be applied along the line. FIG. 7D is a graph showing the derivative of the T1 values. Coming from the center of the line (bright dot inside the LV blood pool), the first peak of the T1-derivative reveals the LV-septum border. The next peak, which has the opposite polarity of the first, reveals the septum-RV border. The pixels within these borders are now classified as "myocardium compartment," and the pixels from the center of the line (pixel 128) to the LV-septum border (pixel 116) classified as "blood compartment."

To obtain one reliable T1 value for blood and another for myocardium, the blood-myocardium border pixels may be discarded. These pixels can experience partial volume effects due to imperfect alignment of the acquired data, and due to limited spatial resolution (thickness and width of the line, resolution within the line). The pixels remaining inside the compartment may be averaged. In the example, T1 values of pixels 110 to 115 can be averaged to obtain T1 of myocardium, and pixels 117 to 128 for T1 of blood. Averaging can reduce errors caused by artifacts such as ghosting, fat-water shifts, and the like. Poor T1 estimation due to low signal-to-noise ratio in the acquired data can also be compensated for by averaging.

It is noted that edge detection need not be done on the line of T1-values. It can also be done on the unprocessed (raw) data line. As long as the septum and blood have different intensity (brightness) at the time of the readout, an edge detection algorithm can be applied for finding the two compartments. This approach may be taken when applying the present subject matter to FIDDLE-type imaging sequences where the preparation combines tissue-signal reduction (magnetization transfer or T2-preparation) and IR. From recovery curves created by such preparation, the T1 cannot readily be derived. Instead of the T1 data line, the first line acquired after the preparation can be used for border detection.

In accordance with embodiments of the present disclosure, TI may be calculated specifically for a selected imaging sequence and for specific protocol parameters selected for the sequence. If the imaging sequence is IR Turbo-FLASH and a precise TI calculation may be too demanding for the scanner's computing power, then TI may be calculated as $\ln(2)*T1$ of the myocardium compartment.

If the imaging sequence is IR Turbo-FLASH and computing power is no issue, then the magnetization of the myocardium compartment may be simulated by using the measured T1 and the imaging sequence. This simulation employs the parameters of the imaging sequence "lines per segment," echo spacing, readout flip angle, effective TR, and inversion efficiency of the IR pulse. It is executed for a range of TIs. The algorithm may subsequently picks the TI where the myocardium compartment has the desired magnetic conditioning, for example a magnetization of 10% of MO when acquiring the center of k-space.

If the imaging sequence is a FIDDLE-type sequence, the adjustment sequence must use the same preparation as the imaging sequence, and not an IR pulse. The acquired data is then not used for the calculation of the pixel T1 values. Rather, it may be used to reconstruct the recovery curves in the myocardium and blood compartment. The algorithm may subsequently find the intersection of both curves. The time between preparation module and the intersection is the TI for the respective FIDDLE-type imaging sequence.

It may be necessary for the calculated TI to be passed to the imaging sequence. In an example implementation, memory may be shared between the adjustment and the imaging sequence, and the imaging sequence may read this memory upon opening its protocol. In another example implementation, a "capture-TI" button may be implemented on the user interface such that, when pressed, the button triggers the run of the adjustment sequence, the TI calculation, and the transfer of this TI to the imaging sequence.

In accordance with embodiments of the present disclosure, an MRI system may implement a combination of the steps of placing a single readout line within a region of interest as described herein; calculating a T1 value (or effective T1 value or finding an intersection of curves) along the single readout line; and automatically detecting the one or more compartments of interest by automatically segmenting it.

The various techniques described herein may be implemented with hardware or software or, where appropriate, with a combination of both. Thus, the methods and apparatus of the disclosed embodiments, or certain aspects or portions thereof, may take the form of program code (i.e., instructions) embodied in tangible media, such as floppy diskettes, CD-ROMs, hard drives, or any other machine-readable storage medium, wherein, when the program code is loaded into and executed by a machine, such as a computer, the machine becomes an apparatus for practicing the presently disclosed subject matter. In the case of program code execution on programmable computers, the computer will generally include a processor, a storage medium readable by the processor (including volatile and non-volatile memory and/or storage elements), at least one input device and at least one output device. One or more programs may be implemented in a high level procedural or object oriented programming language to communicate with a computer system. However, the program(s) can be implemented in assembly or machine language, if desired. In any case, the language may be a compiled or interpreted language, and combined with hardware implementations.

The described methods and apparatus may also be embodied in the form of program code that is transmitted over some transmission medium, such as over electrical wiring or cabling, through fiber optics, or via any other form of transmission, wherein, when the program code is received and loaded into and executed by a machine, such as an EPROM, a gate array, a programmable logic device (PLD), a client computer, a video recorder or the like, the machine becomes an apparatus for practicing the presently disclosed subject matter. When implemented on a general-purpose processor, the program code combines with the processor to provide a unique apparatus that operates to perform the processing of the presently disclosed subject matter.

Features from one embodiment or aspect may be combined with features from any other embodiment or aspect in any appropriate combination. For example, any individual or collective features of method aspects or embodiments may be applied to apparatus, system, product, or component aspects of embodiments and vice versa.

While the embodiments have been described in connection with the various embodiments of the various figures, it is to be understood that other similar embodiments may be used or modifications and additions may be made to the described embodiment for performing the same function without deviating therefrom. Therefore, the disclosed embodiments should not be limited to any single embodiment, but rather should be construed in breadth and scope in accordance with the appended claims. One skilled in the art will readily appreciate that the present subject matter is well adapted to carry out the objects and obtain the ends and advantages mentioned, as well as those inherent therein. The present examples along with the methods described herein are presently representative of various embodiments, are exemplary, and are not intended as limitations on the scope of the present subject matter. Changes therein and other uses will occur to those skilled in the art which are encompassed within the spirit of the present subject matter as defined by the scope of the claims.

What is claimed:

1. A method for adjusting an inversion time setting in a magnetic resonance imaging (MRI) scanner, the method comprising:
    positioning a readout line of the MRI scanner through a compartment of interest of a region of interest in a subject;
    inverting magnetization within the readout line by playing an inversion pulse;
    reading out data along the readout line at a predetermined number of times after play of the inversion pulse;
    determining a T1 value for each pixel along the readout line;
    determining the pixels that belong to first and second portions within the compartment of interest, wherein determining the pixels that belong to first and second portions comprises applying an edge detection algorithm along the line of T1 values;
    determining a T1 value of each of the first and second portions by, for each portion, averaging the pixels within each portion; and
    determining an inversion time based on the determined T1 values such that the compartment of interest has a desired magnetization in an image to be acquired by an imaging sequence.

2. The method of claim 1, wherein the compartment of interest comprises a first portion and a second portion, and wherein positioning a readout line comprises positioning a readout line such that a center of the readout line is within the first portion of the compartment of interest.

3. The method of claim 2, wherein the first portion of the compartment of interest is blood.

4. The method of claim 3, wherein the second portion of the compartment of interest is myocardium.

5. The method of claim 1, wherein playing an inversion pulse comprises playing a spatially non-selective inversion pulse along the readout line.

6. The method of claim 1, wherein reading out data along the readout line comprises reading out data such that a first readout occurs within about 100 milliseconds after playing the inversion pulse and such that a last readout occurs at least 2000 milliseconds after playing the inversion pulse.

7. The method of claim 6, wherein reading out data along the readout line comprises reading out the data at least 10 times.

8. The method of claim 1, wherein determining a T1 value of pixels comprises fitting each of the pixels at least 10 temporal data points to an exponential recovery curve.

9. The method of claim 1, further comprising implementing an edge detection algorithm on a line of T1 values starting at a center in the first portion and searching in a direction of the second portion.

10. The method of claim 1, further comprising using the inversion time for subsequent imaging sequences.

11. The method of claim 1, further comprising calculating inversion time to null in the compartment of interest.

12. The method of claim 1, further comprising determining the positioning for the readout line based on anatomical information of the subject.

13. The method of claim 12, wherein determining the positioning for the readout line comprises using the MRI scanner to automatically determine the positioning for the readout line.

14. The method of claim 12, wherein determining the positioning for the readout line comprises receiving user input for manual positioning of the readout line through the compartment of interest.

15. The method of claim 1, wherein positioning a readout line comprises positioning the readout line at an intersection of a four-chamber view of a heart and a short-axis view closest to a middle between a base of the heart and apex, and wherein a center of the readout line is inside a left ventricular cavity of the heart.

16. The method of claim 1, wherein the compartment of interest comprises a heart, and
    wherein the method further comprising timing the inversion pulse and data read outs to an electrocardiogram of such that the inversion pulse occurs not earlier than 150 milliseconds after an R-wave and any readout occurs within an R-R interval not earlier than 250 milliseconds after a leading R-wave.

17. The method of claim 16, wherein time points of the read outs are limited to diastolic phases of the heart in consecutive R-R intervals.

18. The method of claim 1, further comprising motion correcting acquired lines prior to the determining steps.

19. A method for adjusting an inversion time setting in a magnetic resonance imaging (MRI) scanner, the method comprising:
    positioning a readout line of the MRI scanner through a compartment of interest in a subject;
    conditioning the magnetization within the readout line by playing a combined preparation module comprising at least one inversion pulse;
    reading out data along the readout line at a predetermined number of times after play of the combined preparation module;
    determining an effective T1 value of pixels along the readout line;
    determining the pixels that belong to first and second portions within the compartment of interest;

determining an effective T1 value of each of the first and second portions by, for each portion, averaging the pixels within each portion; and determining an inversion time based on the determined effective T1 values such that the compartment of interest has a desired magnetization in an image to be acquired by an imaging sequence, wherein the calculation of the inversion time TI for the imaging sequence finds the time after the combined preparation module, and wherein the recovery curves of two compartments of interest intersect and passes this time as TI to the subsequent imaging sequence.

20. The method of claim 19, wherein the combined preparation module comprises a series of at least one magnetization transfer pulse, the series being followed or preceded by an IR pulse.

21. The method of claim 19, wherein the combined preparation module comprises a T2-preparation, which is followed or preceded by an IR pulse.

22. The method of claim 19, wherein the combined preparation module comprises a series of at least one T1(rho), T2(rho), or spin-lock contrast imparting pulse, the series being followed or preceded by an IR pulse.

23. The method of claim 19, further comprising a user interface to initiate the steps of playing an inversion pulse along the readout line, reading out data along the readout line, and determining a T1 value.

24. A magnetic resonance imaging (MRI) system comprising:
an MRI device comprising a scanner and configured to generate an MRI signal of a subject; and
computing device configured to:
position a readout line of the scanner through a compartment of interest of a region of interest in the subject;
invert magnetization within the readout line by playing an inversion pulse;
read out data along the readout line at a predetermined number of times after play of the inversion pulse;
determine a T1 value for each pixel along the readout line;
determine the pixels that belong to first and second portions within the compartment of interest, wherein the computing device is configured to apply an edge detection algorithm along the line of T1 values;
determine a T1 value of each of the first and second portions by, for each portion, averaging the pixels within each portion; and
determine an inversion time based on the determined T1 values such that the compartment of interest has a desired magnetization in an image to be acquired by an imaging sequence.

25. The MRI system of claim 24, wherein the compartment of interest comprises a first portion and a second portion, and
wherein the computing device is configured to position a readout line such that a center of the readout line is within the first portion of the compartment of interest.

26. The MRI system of claim 25, wherein the first portion of the compartment of interest is blood.

27. The MRI system of claim 26, wherein the second portion of the compartment of interest is myocardium.

28. The MRI system of claim 24, wherein the computing device is configured to play a spatially non-selective inversion pulse along the readout line.

29. The MRI system of claim 24, wherein the computing device is configured to read out data such that a first readout occurs within about 100 milliseconds after playing the inversion pulse and such that a last readout occurs at least 2000 milliseconds after playing the inversion pulse.

30. The MRI system of claim 29, wherein the computing device is configured to read out the data at least 10 times.

31. The MRI system of claim 24, wherein the computing device is configured to fit each of the pixels at least 10 temporal data points to an exponential recovery curve.

32. The MRI system of claim 24, wherein the computing device is configured to implement an edge detection algorithm on a line of T1 values starting at a center in the first portion and searching in a direction of the second portion.

33. The MRI system of claim 24, wherein the computing device is configured to use the inversion time for subsequent imaging sequences.

34. The MRI system of claim 24, wherein the computing device is configured to calculate inversion time to null in the compartment of interest.

35. The MRI system of claim 24, wherein the computing device is configured to determine the positioning for the readout line based on anatomical information of the subject.

36. The MRI system of claim 35, wherein the computing device is configured to use the MRI scanner to automatically determine the positioning for the readout line.

37. The MRI system of claim 35, wherein the computing device is configured to receive user input for manual positioning of the readout line through the compartment of interest.

38. The MRI system of claim 24, wherein the computing device is configured to position the readout line at an intersection of a four-chamber view of a heart and a short-axis view closest to a middle between a base of the heart and apex, and wherein a center of the readout line is inside a left ventricular cavity of the heart.

39. The MRI system of claim 24, wherein the compartment of interest comprises a heart, and
wherein the computing device is configured to time the inversion pulse and data read outs to an electrocardiogram of such that the inversion pulse occurs not earlier than 150 milliseconds after an R-wave and any readout occurs within an R-R interval not earlier than 250 milliseconds after a leading R-wave.

40. The MRI system of claim 39, wherein time points of the read outs are limited to diastolic phases of the heart in consecutive R-R intervals.

41. The MRI system of claim 24, wherein the computing device is configured to motion correct the acquired lines prior to the determining functions.

42. A magnetic resonance imaging (MRI) system comprising:
an MRI device comprising a scanner and configured to generate an MRI signal of a subject; and
a computing device configured to:
position a readout line of the MRI scanner through a compartment of interest in a subject;
condition the magnetization within the readout line by playing a combined preparation module comprising at least one inversion pulse;
read out data along the readout line at a predetermined number of times after play of the combined preparation module;
determine an effective T1 value of pixels along the readout line;
determine the pixels that belong to first and second portions within the compartment of interest;
determine an effective T1 value of each of the first and second portions by, for each portion, averaging the pixels within each portion; and determine an inversion time based on the determined effective T1 values such that the compartment of interest has a desired magnetization in an image to be acquired by an imaging sequence, wherein the calculation of the inversion time TI for the imaging sequence finds the time after the combined preparation module, and wherein the recovery curves of two compartments of interest intersect and passes this time as TI to the subsequent imaging sequence.

43. The MRI system of claim 42, wherein the combined preparation module comprises a series of at least one magnetization transfer pulse, the series being followed or preceded by an IR pulse.

44. The MRI system of claim 42, wherein the combined preparation module comprises a T2-preparation, which is followed or preceded by an IR pulse.

45. The MRI system of claim 42, wherein the combined preparation module comprises a series of at least one T1(rho), T2(rho), or spin-lock contrast imparting pulse, the series being followed or preceded by an IR pulse.

46. The MRI system of claim 42, further comprising a user interface to initiate the steps of playing an inversion pulse along the readout line, reading out data along the readout line, and determining a T1 value.

47. A method for adjusting an inversion time setting in a magnetic resonance imaging (MRI) scanner, the method comprising:

positioning a single magnetically excited beam as readout line in the MRI scanner through a compartment of interest of a region of interest in a subject;

inverting magnetization within the beam by playing an inversion pulse;

acquiring one readout line along the beam at a predetermined number of times after play of the inversion pulse;

reconstructing the pixels in said readout line at each time of the predetermined number of times after play of the inversion pulse;

determining a T1 value for each pixel along the readout line;

determining the pixels that belong to first and second portions within the compartment of interest;

determining a T1 value of each of the first and second portions by, for each portion, averaging the pixels within each portion; and determining an inversion time based on the determined T1 values such that the compartment of interest has a predetermined magnetization in an image to be acquired by an imaging sequence.

48. A method for adjusting an inversion time setting in a magnetic resonance imaging (MRI) scanner, the method comprising:

positioning a single magnetically excited beam as readout line in the MRI scanner through a compartment of interest of a region of interest in a subject;

inverting magnetization within the beam by playing an inversion pulse;

acquiring one readout line along the beam at a predetermined number of times after play of the inversion pulse;

reconstructing the pixels in said readout line at each time of the predetermined number of times after play of the inversion pulse;

determining a T1 value for each pixel along the readout line;

determining the pixels that belong to first and second portions within the compartment of interest by applying an edge detection algorithm along the pixel line of T1 values;

determining a T1 value of each of the first and second portions by, for each portion, averaging the pixels within each portion; and determining an inversion time based on the determined T1 values such that a predetermined portion of the compartment of interest has a predetermined magnetization in an image to be acquired by an imaging sequence.

49. A method for calculating an inversion time for a predetermined portion of a compartment of interest in a magnetic resonance imaging (MRI) scanner, the method comprising:

creating a single magnetically excited beam by a two-dimensional radio-frequency pulse as readout line in the MRI scanner through a portions of a compartment of interest within a region of interest in a subject;

inverting magnetization within the beam by playing an inversion pulse;

acquiring one readout line along the beam at a predetermined number of times after play of the inversion pulse;

resolving the pixels in said readout line by location using a one-dimensional Fourier Transform for each readout line at each time of the predetermined number of times after play of the inversion pulse;

determining a T1 value for each pixel along the readout line;

determining the pixels that belong to first and second portions within the compartment of interest by applying an edge detection algorithm along the pixel line of T1 values;

determining a T1 value of each of the first and second portions by, for each portion, averaging the pixels within each portion; and determining an inversion time based on the determined T1 values such that a predetermined portion of the compartment of interest has a predetermined magnetization in an image to be acquired by an imaging sequence.

* * * * *